US007435325B2

(12) United States Patent
Shindo et al.

(10) Patent No.: US 7,435,325 B2
(45) Date of Patent: Oct. 14, 2008

(54) METHOD FOR PRODUCING HIGH PURITY NICKLE, HIGH PURITY NICKLE, SPUTTERING TARGET COMPRISING THE HIGH PURITY NICKEL, AND THIN FILM FORMED BY USING SAID SPATTERING TARGET

(75) Inventors: Yuichiro Shindo, Ibaraki (JP); Kouichi Takemoto, Ibaraki (JP)

(73) Assignee: Nippon Mining & Metals Co., Ltd, Tokyo (JP)

( * ) Notice: Subject to any disclaimer, the term of this patent is extended or adjusted under 35 U.S.C. 154(b) by 393 days.

(21) Appl. No.: 10/471,112

(22) PCT Filed: Oct. 22, 2001

(86) PCT No.: PCT/JP01/09237

§ 371 (c)(1),
(2), (4) Date: Sep. 5, 2003

(87) PCT Pub. No.: WO03/014421

PCT Pub. Date: Feb. 20, 2003

(65) Prior Publication Data

US 2004/0069652 A1    Apr. 15, 2004

(30) Foreign Application Priority Data

Aug. 1, 2001    (JP)    ............... 2001-233036

(51) Int. Cl.
C25C 1/08        (2006.01)
C25C 1/00        (2006.01)

(52) U.S. Cl. .................. 205/596; 205/594; 205/595; 205/586; 205/587; 205/588; 205/589; 205/590; 205/560

(58) Field of Classification Search ................. 205/367, 205/370, 560, 580, 589–591, 271–280, 594–596, 205/586–588; 204/233–236, 261–265
See application file for complete search history.

(56) References Cited

U.S. PATENT DOCUMENTS

| 3,446,720 A | * | 5/1969 | Brooks ................ 205/590 |
| 3,616,331 A | * | 10/1971 | O'Neill et al. .......... 205/584 |
| 3,656,940 A | * | 4/1972 | Gandon et al. .......... 423/139 |
| 4,053,400 A | * | 10/1977 | Merker et al. .......... 205/99 |
| 5,192,418 A | * | 3/1993 | Hughes et al. .......... 205/100 |
| 5,403,460 A | * | 4/1995 | Sala et al. ............ 204/252 |
| 5,458,745 A | * | 10/1995 | Hradil ................ 205/589 |
| 5,569,370 A | * | 10/1996 | Gomez ................ 205/560 |
| 2004/0003894 A1 | * | 1/2004 | Hsu et al. ........... 156/345.12 |

FOREIGN PATENT DOCUMENTS

| CA | 860872 A |   | 3/1971 |
| CA | 860872 A | * | 3/1971 |
| JP | 31-4904 B |   | 6/1956 |
| JP | 11-152592 | * | 6/1999 |
| JP | 2000-054040 | * | 2/2000 |
| JP | 2000-219988 | * | 8/2000 |

OTHER PUBLICATIONS

English Translation of Claim of JP 31-4904 B, Jun. 1956.
Patent Abstracts of Japan, One page English Abstract of JP 11-152592, Jun. 1999.
Patent Abstracts of Japan, One page English Abstract of JP 2000-219988, Aug. 2000.

* cited by examiner

*Primary Examiner*—Roy King
*Assistant Examiner*—Lois L. Zheng
(74) *Attorney, Agent, or Firm*—Howson & Howson LLP

(57) ABSTRACT

Upon performing electrolysis with a solution containing nickel as the electrolytic solution, anolyte is adjusted to pH 2 to 5; impurities such as iron, cobalt and copper contained in the anolyte are eliminated by combining any one or two or more of the methods among adding an oxidizing agent and precipitating and eliminating the impurities as hydroxide, eliminating the impurities through preliminary electrolysis, or adding Ni foil and eliminating the impurities through displacement reaction; impurities are thereafter further eliminated with a filter; and the impurity-free solution is employed as catholyte to perform the electrolysis. The present invention relates to a simple method of performing electrolytic refining employing a solution containing nickel from nickel raw material containing a substantial amount of impurities, and provides technology on efficiently manufacturing high purity nickel having a purity of 5N (99.999 wt %) or more.

20 Claims, 1 Drawing Sheet

METHOD FOR PRODUCING HIGH PURITY NICKLE, HIGH PURITY NICKLE, SPUTTERING TARGET COMPRISING THE HIGH PURITY NICKEL, AND THIN FILM FORMED BY USING SAID SPATTERING TARGET

FIELD OF THE INVENTION

The present invention pertains to a method of manufacturing high purity nickel having a purity of 5N (99.999 wt %) or more through electrolytic refining employing a solution containing nickel, such high purity nickel, a sputtering target formed from the high purity nickel, and a thin film formed with the sputtering target.

BACKGROUND OF THE INVENTION

Generally speaking, high purity nickel is required to reduce, as much as possible, alkali metals, radioactive elements, transition metal elements and gas components, and is widely used particularly as a sputtering target material for forming VLSI electrodes and wiring, or for forming magnetic thin films.

Alkali metals such as Na and K easily move within the gate insulation film, and cause deterioration of the MOS-LSI interfacial quality. Radioactive elements such as U and Th cause soft errors of elements with the emitted a rays. Meanwhile, transition metal elements such as Fe also cause trouble at the interface bonding area.

Further, gas components such as carbon and oxygen are not preferable in that they cause the generation of particles during sputtering.

In general, when manufacturing high purity nickel of a 5N level, it is standard to refine the solution through ionic exchange or solvent extraction, and obtain high purification by further performing electrolytic winning or electrolytic refining thereto. Nevertheless, there were problems of inefficiency in that the steps in the method adopting the foregoing solvent extraction process are complex, and it is necessary to give consideration to the safety of the extract agent since a special solvent must be used.

Although it is also possible to consider a relatively simple method of performing electrolysis employing a solution containing nickel upon manufacturing high purity nickel of a 5N level, it could not necessarily be said that the employment of processes such as the foregoing solvent extraction are efficient.

OBJECT OF THE INVENTION

An object of the present invention is to provide a simple method of performing electrolysis employing a solution containing nickel from nickel raw material containing a substantial amount of impurities such as iron, carbon, oxygen and so on, and providing technology on efficiently manufacturing high purity nickel having a purity of 5N (99.999 wt %) or more from such raw material.

SUMMARY OF THE INVENTION

In order to overcome the foregoing problems, the present inventors have discovered that high purity nickel can be manufactured efficiently by eliminating impurities such as iron from anolyte of a solution containing nickel as hydroxide, and employing the impurity-free solution as catholyte.

Based on the foregoing discovery, the present invention provides:

1. A manufacturing method of high purity nickel, wherein, upon performing electrolysis with a solution containing nickel as the electrolytic solution, anolyte is adjusted to pH 2 to 5; impurities such as iron, cobalt and copper contained in the anolyte are eliminated by combining any one or two or more of the methods among adding an oxidizing agent and precipitating and eliminating the impurities as hydroxide, eliminating the impurities through preliminary electrolysis, or adding Ni foil and eliminating the impurities through displacement reaction; impurities are thereafter further eliminated with a filter; and the impurity-free solution is employed as catholyte to perform the electrolysis;

2. A manufacturing method of high purity nickel according to claim 1, wherein an anode and cathode are partitioned with a diaphragm; anolyte is intermittently or consecutively extracted; an oxidizing agent is added thereto so as to precipitate impurities such as iron as hydroxide; impurities are further eliminated with a filter; and the impurity-free solution is intermittently or consecutively added to the cathode side;

3. A manufacturing method of high purity nickel according to claim 1, wherein an anode and cathode are partitioned with a diaphragm; anolyte is intermittently or consecutively extracted; impurities such as iron, cobalt and copper are eliminated by performing preliminary electrolysis to this anolyte; impurities are further eliminated with a filter; and the impurity-free solution is intermittently or consecutively added to the cathode side;

4. A manufacturing method of high purity nickel according to claim 1, wherein an anode and cathode are partitioned with a diaphragm; anolyte is intermittently or consecutively extracted; impurities such as iron, cobalt and copper are eliminated through displacement reaction by adding nickel foil to this anolyte; impurities are further eliminated with a filter; and the impurity-free solution is intermittently or consecutively added to the cathode side;

5. A manufacturing method of high purity nickel according to each of claims 1 to 4, wherein activated carbon is employed as the filter;

6. A manufacturing method of high purity nickel according to each of claims 1 to 5, wherein the concentration of iron within the electrolytic solution after filtering is 1 mg/L or less;

7. A manufacturing method of high purity nickel according to each of claims 1 to 6, wherein the electrolytic nickel obtained through electrolysis is subjected to vacuum melting such as electron beam melting;

8. High purity nickel that is 5N (99.999 wt %) or more excluding gas components in which as impurities O:30 wtppm or less and C,N,S,P,F are respectively 10 wtppm or less; a target formed from the high purity nickel; and a thin film formed through sputtering employing the target; and 9. High purity nickel manufactured according to claims 1 to 7 that is 5N (99.999 wt %) or more excluding gas components in which as impurities O:30 wtppm or less and C,N, S,P,F are respectively 10 wtppm or less; a target formed from the high purity nickel; and a thin film formed through sputtering employing the target.

DETAILED DESCRIPTION OF THE PREFERRED EMBODIMENT

Figure 1:
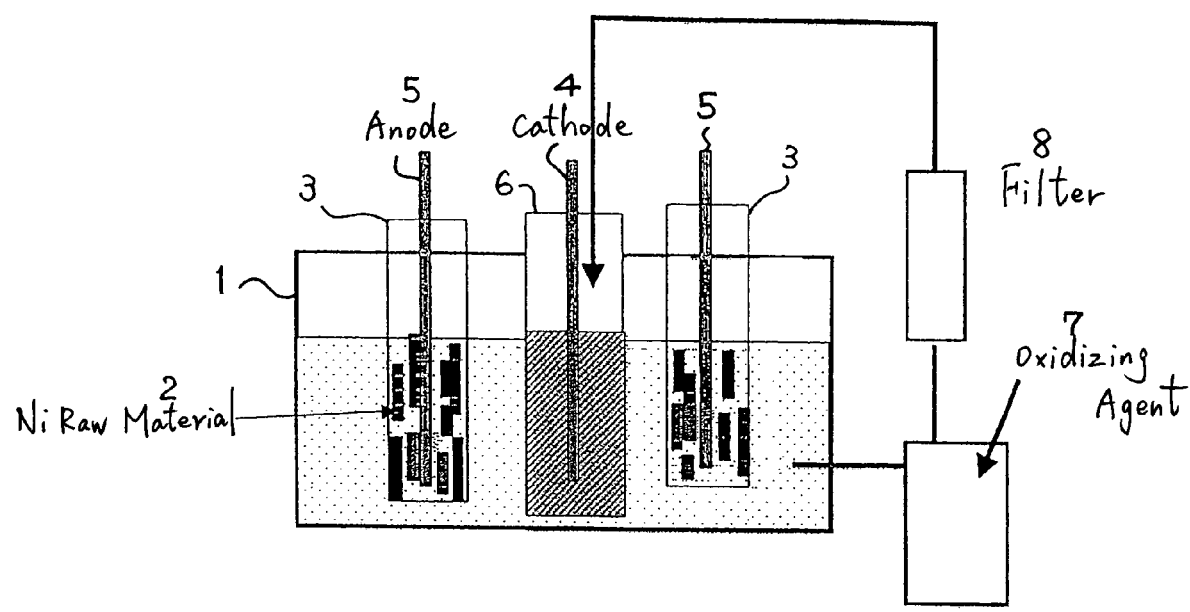
FIG. 1 is a diagram showing the outline of the electrolysis process.

Employing an electrolytic bath 1 shown in FIG. 1, a massive nickel raw material 2 of a 4N level is added to an anode basket 3 and made an anode 5, and nickel or the like is employed as a cathode 4 for performing electrolysis. The nickel raw material mainly contains a great amount of iron, carbon, oxygen, and so on.

Electrolysis is performed under the conditions where the bath temperature is 10 to 70° C., nickel concentration is 20 to 120 g/L, and current density is 0.1 to 10 A/dm². The productivity deteriorates when the current density is less than 0.1 A/dm², and nodules are generated when it exceeds 10 A/dm², which is not preferable since the anode 5 and cathode 4 will contact each other, and, therefore, the current density is set within the range of 0.1 to 10 A/dm².

The anode 5 and cathode 4 are partitioned with a diaphragm 6 and anolyte is intermittently or consecutively extracted. The anolyte is adjusted to pH 2 to 5. A cathode box is separated from the outer solution (anolyte) via the diaphragm. An oxidizing agent 7 is added to the extracted anolyte in order to precipitate impurities such as iron, cobalt and copper as hydroxide. In other words, binary iron become ternary by the oxidizing agent 7, and is precipitated as $Fe(OH)_3$. Hydrogen peroxide, nitric acid, and so on may be used as the oxidizing agent 7.

Moreover, the extracted anolyte may be added to a preliminary electrolytic bath in order to eliminate impurities such as iron, cobalt and copper through electrolysis.

Furthermore, the extracted anolyte may be added to a displacement bath so as to perform displacement with impurities such as iron, cobalt and copper in the electrolytic solution using nickel foil, and thereby eliminating such impurities.

Although FIG. 1 shows a process of adding an oxidizing agent, this process 7 can be substituted with preliminary electrolysis or the displacement method in order to facilitate elimination of impurities.

Impurities can also be eliminated by respectively combining the foregoing oxidizing agent, preliminary electrolysis or displacement method.

Impurities such as these sediments are eliminated with a filter 8. It is preferable that activated carbon is used as the filter. The activated carbon filter 8 yields an effect of eliminating organic matter eluted from the container or the like in addition to impurities such as the foregoing precipitated oxides. According to the above, the concentration of iron within the electrolytic solution can be made 1 mg/L or less.

After the elimination of impurities, this solution is intermittently or consecutively introduced to the cathode side, and used as catholyte for performing electrolytic refining.

The current efficiency will be 80 to 100%. According to the above, electrolytic nickel (deposited to the cathode) having a purity of 5N is obtained. In other words, the purity is 5N (99.999 wt %) excluding gas components, in which as impurities O:30 wtppm or less and C,N,S,P,F,H are respectively 10 wtppm or less.

Moreover, the electrolytic nickel obtained through electrolysis may be subjected to vacuum melting such as electron beam melting. Alkali metals such as Na and K as well as other volatile impurities and gas components can be effectively eliminated with such vacuum melting.

Further, since ion exchange resin and solvent extraction are not used in the present invention, organic matter will not get mixed in, and it is thereby possible to suppress impurity elements arising from organic solvents.

EXAMPLES AND COMPARATIVE EXAMPLES

The present invention is now described with reference to the Examples and Comparative Examples. These Examples are merely illustrative, and the present invention shall in no way be limited thereby. In other words, the present invention shall include, within the scope of its technical spirit, any and all modes or modifications other than the Examples of this invention.

Example 1

With the electrolytic bath shown in FIG. 1, 1 kg of massive nickel raw material of a 4N level was made an anode, and electrolysis was performed to a cathode with a nickel plate of a 2N level. The content of impurities in the raw material is shown in Table 1. The nickel raw material mainly contains a great amount of iron, carbon, oxygen, and so on.

Electrolysis was performed for 40 hr under a bath temperature of 50° C., in which 1 mol/L of hydrofluoric acid was added to a sulfuric acid electrolytic solution, a nickel concentration of 50 g/L and a current density of 2 A/dm².

The solution pH was adjusted to 2. Here, anolyte was intermittently extracted. Hydrogen peroxide ($H_2O_2$) was added to the extracted anolyte to change the binary iron to ternary iron, and impurities such as iron were precipitated as hydroxide $Fe(OH)_3$.

Further, impurities such as these sediments were eliminated with an activated carbon filter. According to the above, it was possible to make the concentration of iron within the electrolytic bath to be 1 mg/L or less.

After the elimination of impurities, this solution was intermittently introduced to the cathode side; that is, within the cathode basket, and used as catholyte to perform electrolysis.

Approximately 1 kg of electrolytic nickel (deposited to the cathode) was obtained. The purity reached 5N. In other words, the purity was 5N (99.999 wt %) or more excluding gas components, in which as impurities O:30 wtppm or less and C,N,S,P,F were respectively 10 wtppm or less.

TABLE 1

|  | Fe | O | C | N | S | P | F | H |
|---|---|---|---|---|---|---|---|---|
| Raw Material | 50 | 200 | 50 | 10 | 10 | 10 | 10 | 10 |
| Example 1 | 2 | 20 | <10 | <10 | <10 | <10 | <10 | <10 |
| Example 2 | 1 | <10 | <10 | <10 | <10 | <10 | <10 | <10 |
| Comparative Example 1 | 50 | 60 | <10 | <10 | <10 | <10 | <10 | <10 |

(wtppm)

Example 2

With the same electrolytic bath as Example 1, massive nickel raw material of a 4N level was made an anode, and electrolysis was performed to a cathode with a nickel plate of a 3N level.

Electrolysis was performed for 40 hr under a bath temperature of 30° C., with a hydrochloric acid electrolytic solution, a nickel concentration of 80 g/L and a current density of 5 A/dm².

As with Example 1, the solution pH was adjusted to 2. Here, anolyte was intermittently extracted. Hydrogen peroxide ($H_2O_2$) was added to the extracted anolyte to change the binary iron to ternary iron, and impurities such as iron were precipitated as hydroxide $Fe(OH)_3$.

Further, impurities such as these sediments were eliminated with an activated carbon filter. According to the above, it was possible to make the concentration of iron within the electrolytic bath to be 1 mg/L or less.

After the elimination of impurities, this solution was intermittently introduced to the cathode side; that is, within the cathode basket, and used as catholyte to perform electrolysis.

Approximately 1 kg of electrolytic nickel (deposited to the cathode) was obtained. Electron beam melting was further performed to this electrolytic nickel. Electron beam melting was performed under the conditions of 1 A, 30 kW, and degree of vacuum of 2 to $5\times10^{-4}$ mmHg. The foregoing results are similarly shown in Table 1.

Comparative Example 1

With the electrolytic bath shown in FIG. 1, 1 kg of massive nickel raw material of a 4N level was made an anode, and electrolysis was performed to a cathode with a nickel plate of a 3N level. The content of impurities in the raw material is shown in Table 1.

Electrolysis was performed for 40 hr under a bath temperature of 50° C., in which 1 mol/L of hydrofluoric acid was added to a sulfuric acid electrolytic solution, a nickel concentration of 50 g/L and a current density of 2 A/dm².

The solution pH was adjusted to 2. Here, anolyte was not extracted and electrolysis was continued.

Approximately 1 kg of electrolytic nickel (deposited to the cathode) was obtained.

The foregoing results are similarly shown in Table 1.

As shown in Table 1, with Example 1, it was possible to make the raw material iron from 50 wtppm to 2 wtppm, oxygen from 200 wtppm to 20 wtppm, carbon from 50 wtppm to less than 10 wtppm, C, N, S, P, F from 10 wtppm to less than 10 wtppm, respectively.

Moreover, in Example 2, it was possible to make iron 1 wtppm, oxygen less than 10 wtppm, and other impurities less than 10 wtppm.

Contrarily, in Comparative Example 1, although it was possible to make C, N, S, P, F from 10 wtppm to less than 10 wtppm, respectively, iron was 50 wtppm and oxygen was 60 wtppm, and refining effects were inferior in comparison to the Examples, and, in particular, the elimination of iron was difficult.

Example 3

1 kg of massive nickel raw material of a 3N level was made an anode, and electrolysis was performed to a cathode with an aluminum plate of a 2N level. The content of impurities in the raw material is shown in Table 2. The nickel raw material mainly contains a great amount of iron, carbon, copper, carbon, oxygen, and so on.

Electrolysis was performed for 25 hr under electrolytic conditions of a bath temperature of 40° C., in which 1 mol/L of hydrochloric acid was added to a sulfuric acid electrolytic solution, a nickel concentration of 100 g/L and a current density of 3 A/dm².

The solution pH was adjusted to 2.5. Here, anolyte was intermittently extracted. Electrolysis was performed to the extracted anolyte in a preliminary electrolytic bath under a current density of 0.1 A/dm², and impurities such as iron, cobalt and copper were eliminated.

Further, organic matter within the electrolytic solution was eliminated with an activated carbon filter. According to the above, it was possible to make the concentration of iron, cobalt and copper within the electrolytic bath to be 1 mg/L or less.

After the elimination of impurities, this solution was intermittently introduced to the cathode side; that is, within the cathode basket, and used as catholyte to perform electrolysis.

As a result, approximately 1.1 kg of electrolytic nickel was obtained. The purity reached 5N. In other words, the purity was 5N (99.999 wt %) or more excluding gas components, in which as impurities O:20 wtppm or less and C,N,S,P,F were respectively 10 wtppm or less. The foregoing results in comparison to the raw materials are shown in Table 2.

Example 4

1 kg of massive nickel raw material of a 3N level was made an anode, and electrolysis was performed to a cathode with a titanium plate of a 2N level. The content of impurities in the raw material is shown in Table 2. The nickel raw material mainly contains a great amount of iron, carbon, copper, carbon, oxygen, and so on.

Electrolysis was performed for 50 hr under electrolytic conditions of a bath temperature of 60° C., in which 1 mol/L of hydrochloric acid was added to a sulfuric acid electrolytic solution, a nickel concentration of 100 g/L and a current density of 1.5 A/dm².

The solution pH was adjusted to 2.7. Here, anolyte was intermittently extracted. The extracted anolyte was replaced with impurities within the electrolytic solution with Ni foil of a 2N level in a displacement bath, and impurities such as iron, cobalt and copper were eliminated.

Further, organic matter within the electrolytic solution was eliminated with an activated carbon filter. According to the above, it was possible to make the concentration of iron, cobalt and copper within the electrolytic bath to be 1 mg/L or less.

After the elimination of impurities, this solution was intermittently introduced to the cathode side; that is, within the cathode basket, and used as catholyte to perform electrolysis.

As a result, approximately 1.1 kg of electrolytic nickel was obtained. The purity reached 5N. In other words, the purity was 5N (99.999 wt %) or more excluding gas components, in which as impurities O:20 wtppm or less and C,N,S,P,F were respectively 10 wtppm or less. The foregoing results in comparison to the raw materials are shown in Table 2.

Example 5

During the steps of foregoing Example 3, anolyte was intermittently extracted, electrolysis was performed to the extracted anolyte in a preliminary electrolytic bath under a current density of 0.1 A/dm², and impurities such as iron, cobalt and copper were eliminated under the same conditions as the displacement reaction in the displacement bath of Example 4 (combination of preliminary electrolysis and displacement reaction).

And, with the same steps as Example 3 excluding the foregoing step, approximately 1.1 kg of electrolytic nickel was obtained. As a result, the purity was 5N or more excluding gas components, in which as impurities O:10 wtppm or less and C,N,S,P,F were respectively 10 wtppm or less. The foregoing results in comparison to the raw materials are shown in Table 2.

TABLE 2

|  | Fe | Co | Cu | O | C | N | S | P | F | H |
|---|---|---|---|---|---|---|---|---|---|---|
| Raw Material | 30 | 20 | 10 | 150 | 40 | 10 | 10 | 10 | 10 | 10 |
| Example 3 | 3 | 1 | 1 | 20 | <10 | <10 | <10 | <10 | <10 | <10 |
| Example 4 | 5 | 2 | 1 | 20 | <10 | <10 | <10 | <10 | <10 | <10 |
| Example 5 | 1 | 1 | 0.3 | 10 | <10 | <10 | <10 | <10 | <10 | <10 |

(wtppm)

According to the above, with the method of the present invention of partitioning the anode and cathode with a diaphragm, intermittently or consecutively extracting the anolyte, adding an oxidizing agent thereto to precipitate impurities such as iron as hydroxide, further eliminating impurities with a filter, and performing electrolysis by intermittently or consecutively adding the impurity-free solution to the cathode side, it is clear that iron can be effectively eliminated, and, upon obtaining high purity nickel, that it is a simple yet extremely effective method.

As described above, provided is a simple method of performing electrolytic refining with a solution containing nickel from a nickel raw material containing a substantial amount of impurities such as iron, carbon, oxygen, and so on. Pursuant to the improvement of a simple manufacturing process, the present invention yields a significant effect of enabling the efficient manufacture of high purity nickel having a purity of 5N (99.999 wt %) or more from the foregoing raw material.

What is claimed is:

1. A manufacturing method of high purity 5N (99.999 wt %) or higher nickel, wherein, upon separating an electrolytic bath with a diaphragm to define an anode side and a cathode side of the electrolytic bath and performing electrolysis with a solution containing nickel as the electrolytic solution, anolyte existing in the anode side is extracted intermittently or consecutively, and the extracted anolyte is adjusted to pH 2 to 5; impurity iron contained in the extracted anolyte is eliminated by adding an oxidizing agent to the anolyte and precipitating and eliminating said impurity iron as hydroxide; cobalt and copper impurities are eliminated by at least one of performing preliminary electrolysis to the extracted anolyte and performing displacement reaction by adding nickel foil to the extracted anolyte; impurities including precipitated oxides are thereafter eliminated with an activated carbon filter to provide a substantially impurity-free solution; the impurity-free solution is introduced intermittently or consecutively into the cathode side only of the electrolytic bath such that a concentration of iron within the electrolytic solution in the electrolytic bath is 1 mg/L or less; and the impurity-free solution is employed as catholyte to perform said electrolysis, said 5N (99.999 wt %) or higher nickel being obtained without method steps of ionic exchange and solvent extraction.

2. A method according to claim 1, wherein electrolytic nickel obtained though said electrolysis is subjected to one of vacuum melting and electron beam melting.

3. A method according to claim 1, wherein said oxidizing agent is hydrogen peroxide.

4. A method according to claim 1, wherein the cobalt and copper impurities are eliminated by performing preliminary electrolysis to the extracted anolyte and by performing displacement reaction by adding nickel foil to the extracted anolyte.

5. A method according to claim 1, further comprising the step of forming a sputtering target from the high purity 5N (99.999 wt %) or higher nickel.

6. A method according to claim 5, further comprising the step of forming electrodes and wiring of very-large-scale integrated (VSLI) circuits with said sputtering target.

7. A method according to claim 1, wherein pH of the extracted anolyte is adjusted to about 2 to 2.7.

8. A method according to claim 7, wherein an anode positioned in the anode side of the electrolytic bath is made of nickel raw material having a purity of 3N (99.9 wt %) or 4N (99.99%).

9. A method according to claim 1, wherein said step of eliminating impurity iron contained in the extracted anolyte consists only of said step of adding an oxidizing agent to said extracted anolyte, said step of precipitating said impurity iron as hydroxide, and said step of filtering said extracted anolyte through said activated carbon filter to remove said precipitated oxides.

10. A method for manufacturing high purity nickel, comprising the steps of:
    partitioning an anode and a cathode of an electrolytic bath with a diaphragm to define an anode side and a cathode side of the electrolytic bath, the anode being made of nickel raw material of a purity of at least 3N (99.9wt %);
    performing electrolysis within the electrolytic bath;
    extracting anolyte intermittently or consecutively from the anolyte side of the electrolytic bath;
    adjusting pH of the extracted anolyte to about 2 to 5;
    eliminating impurity iron contained in the extracted anolyte by adding an oxidizing agent to said extracted anolyte and precipitating said impurity iron as hydroxide;
    eliminating cobalt and copper impurities by at least one of adding the extracted anolyte to a preliminary electrolytic bath to eliminate cobalt and copper impurities through preliminary electrolysis and adding an Ni foil to the extracted anolyte to eliminate cobalt and copper impurities though displacement reaction;
    after said eliminating steps, filtering said extracted anolyte through an activated carbon filter to remove precipitated oxides and provide a substantially impurity-free solution;
    adding the impurity-free solution intermittently or consecutively only to the cathode-side of the electrolytic bath;
    performing electrolytic refining by using a cathode side solution added with said impurity free solution; and
    obtaining, without ionic exchange and solvent extraction refining steps, nickel having a purity of at least 5N (99.999 wt %), excluding gas components, in the form of electrolytic nickel deposited to the cathode.

11. A method according to claim 10, further comprising the step of subjecting said electrolytic nickel to vacuum melting.

12. A method according to claim 10, wherein said oxidizing agent is hydrogen peroxide.

13. A method according to claim 12, wherein a concentration of iron within the electrolytic bath is maintained at 1 mg/L or less.

14. A method according to claim 13, wherein said step of eliminating cobalt and copper impurities includes said step of adding the extracted anolyte to a preliminary electrolytic bath to eliminate cobalt and copper impurities through preliminary electrolysis and said step of adding an Ni foil to the extracted anolyte to eliminate cobalt and copper impurities through displacement reaction.

15. A method according to claim 13, further comprising the step of forming a sputtering target from the high purity 5N (99.999 wt %) or higher electrolytic nickel deposited to the cathode.

16. A method according to claim 15, further comprising the step of forming electrodes and wiring of very-large-scale integrated (VSLI) circuits with said sputtering target.

17. A method according to claim 10, wherein, during said adjusting pH step, pH of the extracted anolyte is adjusted to about 2 to 2.7.

18. A method according to claim 10, wherein, during said adjusting pH step, pH of the extracted anolyte is adjusted to about 2, 2.5 or 2.7.

19. A method according to claim 10, wherein the anode is made of nickel raw material having a purity of 4N (99.99%).

20. A method according to claim 10, wherein said step of eliminating impurity iron contained in the extracted anolyte consists only of said step of adding an oxidizing agent to said extracted anolyte, said step of precipitating said impurity iron as hydroxide, and said step of filtering said extracted anolyte through said activated carbon filter to remove said precipitated oxides.

* * * * *